(12) United States Patent
Traverso et al.

(10) Patent No.: US 11,784,175 B2
(45) Date of Patent: Oct. 10, 2023

(54) INTEGRATED CIRCUIT BRIDGE FOR PHOTONICS AND ELECTRICAL CHIP INTEGRATION

(71) Applicant: Cisco Technology, Inc., San Jose, CA (US)

(72) Inventors: Matthew J. Traverso, Saratoga, CA (US); Sandeep Razdan, Burlingame, CA (US); Ashley J. Maker, Danville, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/302,853

(22) Filed: May 13, 2021

(65) Prior Publication Data
US 2021/0280568 A1 Sep. 9, 2021

Related U.S. Application Data

(62) Division of application No. 15/961,163, filed on Apr. 24, 2018, now Pat. No. 11,043,478.

(51) Int. Cl.
| | |
|---|---|
| *H01L 23/00* | (2006.01) |
| *H01L 25/16* | (2023.01) |
| *H01L 31/02* | (2006.01) |
| *H01L 23/498* | (2006.01) |
| *H01L 21/48* | (2006.01) |

(52) U.S. Cl.
CPC ........ *H01L 25/167* (2013.01); *H01L 21/4846* (2013.01); *H01L 23/49827* (2013.01); *H01L 23/49838* (2013.01); *H01L 31/02005* (2013.01); *H01L 23/49816* (2013.01); *H01L 24/16* (2013.01); *H01L 2224/16145* (2013.01); *H01L 2224/16225* (2013.01)

(58) Field of Classification Search
CPC ............... H01L 23/28; H01L 23/49827; H01L 23/49838; H01L 25/167; H01L 21/4846; H01L 2224/16145; H01L 2224/16225
See application file for complete search history.

(56) References Cited

U.S. PATENT DOCUMENTS

| | | | | |
|---|---|---|---|---|
| 10,162,139 | B1 * | 12/2018 | Wang | G02B 6/4246 |
| 2014/0273354 | A1 * | 9/2014 | Ramaswami | H01L 21/486 |
| | | | | 438/126 |
| 2018/0061741 | A1 * | 3/2018 | Beyne | H01L 23/481 |
| 2018/0156972 | A1 * | 6/2018 | Kainuma | G02B 6/4272 |

* cited by examiner

*Primary Examiner* — Reema Patel
(74) *Attorney, Agent, or Firm* — Patterson + Sheridan, LLP

(57) ABSTRACT

An optoelectronic assembly and methods of fabrication thereof are provided. The assembly includes a mold compound; a photonic integrated circuit (PIC) embedded in the mold compound, that has a face exposed from the mold compound in a first plane; an interposer embedded in the mold compound, that has a face exposed from the mold compound in the first plane (i.e., co-planar with the exposed face of the PIC); and an electrical integrated circuit (EIC) coupled to the exposed face of the PIC and the exposed face of the interposer, that establishes bridging electrical connections between the PIC and the interposer.

17 Claims, 17 Drawing Sheets

INTEGRATED CIRCUIT BRIDGE FOR PHOTONICS AND ELECTRICAL CHIP INTEGRATION

CROSS-REFERENCE TO RELATED APPLICATIONS

This application is a divisional of co-pending U.S. patent application Ser. No. 15/961,163, filed Apr. 24, 2018. The aforementioned related patent application is herein incorporated by reference in its entirety

TECHNICAL FIELD

Embodiments presented in this disclosure generally relate to electrically connecting a photonic integrated circuit with silicon based electrical integrated circuits.

BACKGROUND

A photonic chip and an electrical chip can be wire bonded to a shared substrate and/or to each other. However, using wire bonding to connect the photonic chip and the electrical chip to a shared substrate requires the use of external ceramics or Ball Grid Array (BGA) substrates with Vertical Interconnect Accesses (VIAs), which is not desired for achieving dense integration with other Application-Specific Integrated Circuits (ASICs). Also, using wire bonding to connect the photonic chip and the electrical chip with a shared substrate requires that the Input/Output (I/O) interfaces are arranged on the top surface of the photonic chip, which limits the number of I/O interfaces. Also, such wire bonded interconnections can cause several issues in signal integrity for Photonic high speed transmissions (e.g., >25 Gigabits/second) related to parasitic capacitance, mutual inductance and impedance mismatches with the rest of the on-chip and on-substrate circuits. Furthermore, solutions that connect the photonic chip to the electrical chip without wire bonding often require large, and expensive-to-produce, photonic chips to provide sufficiently large surface areas needed to establish connections between the chips and the shared substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
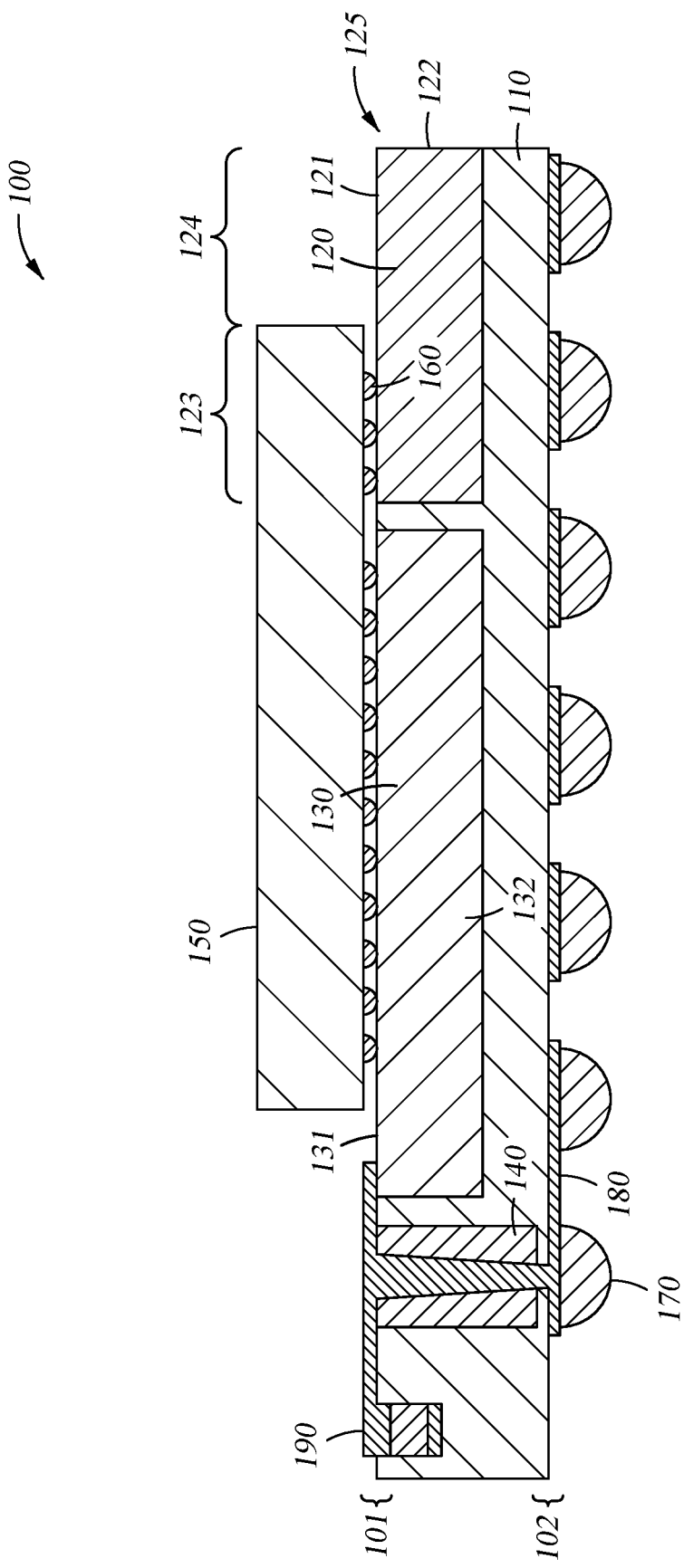
FIG. 1 illustrates a side view of an example optoelectronic assembly according to one embodiment of the present disclosure.

One embodiment presented in this disclosure provides an optoelectronic assembly that comprises: a mold compound; a photonic integrated circuit (PIC) embedded in the mold compound, the PIC having a face that is exposed from the mold compound; an interposer embedded in the mold compound, the interposer having a face that is exposed from the mold compound and is co-planar with the face of the PIC; and an electrical integrated circuit (EIC) coupled to the face of the PIC exposed from the mold compound and to the face of the interposer exposed from the mold compound, the EIC comprising bridging electrical connections between the PIC and the interposer.

Another embodiment presented in this disclosure provides reconstituted wafer, comprising: a mold compound; a plurality of dies embedded of in the mold compound, each die of the plurality of dies including: a Photonic Integrated Circuit (PIC) embedded in the mold compound, having an exposed face free of the mold compound; an interposer embedded in the mold compound, having a first face free of the mold compound that is coplanar to the exposed face of the PIC, and having a second face free of the mold compound that is opposite to the first face; and an Electrical Integrated Circuit (EIC) connected to a portion of the exposed face of the PIC and to a portion of the first face of the interposer.

In a further embodiment presented in this disclosure, a method of fabricating optoelectronic assemblies is provided, the method comprising: positioning a Photonic Integrated Circuit (PIC) and an interposer on a carrier, wherein the PIC has an exposed face and the interposer has a first face coplanar with the exposed face; encapsulating the PIC and the interposer using a mold compound to form a reconstituted wafer including the PIC and the interposer, the reconstituted wafer having a first side coplanar with the exposed face and a second side opposite to the first side, wherein the mold compound does not cover the exposed face and the first face; removing a portion of the mold compound from the second side to reveal a portion of the interposer opposite to the first face; and bonding an Electrical Integrated Circuit (EIC) with the PIC face and the interposer face to electrically bridge the PIC and the interposer.

Example Embodiments

Integrated Circuits (IC) of various types are made of various materials with various physical properties, costs of manufacture, and intended uses. A Photonic IC (PIC) is designed to perform optical operations, such as, for example, to convert optical signals to or from electrical signals as part of a fiber optic system. An Electric IC (EIC) is designed to perform operations using electrical signal, and may be coupled with a PIC to deliver electrical data signals to modulate optical signals, receive converted optical signals as electrical signals to analyze or pass to other circuits, or provide power to the PIC for the analysis or conversion of optical signals to or from electrical signals. PICs are typically made of materials with higher electrical parasitic properties and have higher production costs than a comparable EIC, and therefore optoelectronic assemblies use an EIC in combination with a PIC to perform integrated optical and electronic processing to reduce cost and improve performance efficiencies. Smaller PICs provide greater savings in costs and performance efficiencies relative to larger PICs in optoelectronic assemblies, but PICs should be large enough to incorporate optical interconnects (e.g., for fiber optic cables) and electrical interconnects to receive and transmit electrical signals to and from an associated EIC.

In one embodiment, a PIC and an EIC are coupled with each other to form an optoelectronic assembly using a fan-out wafer level integration in which an interposer substrate and the PIC are embedded together to establish a coplanar top-surface on which an EIC bridges the PIC with electrical connections in the interposer substrate. This embodiment allows for the use of smaller, easier to produce, less expensive PICs that do not need to provide surface area for wire bonding or large EIC attach areas.

FIG. 1 illustrates a side view of an example optoelectronic assembly 100 according to one embodiment of the present disclosure. The example optoelectronic assembly 100 illustrated includes a mold compound 110 that embeds a PIC 120, an interposer 130, and a constructed VIA 140 embedded therein. An EIC 150 is coupled to both the PIC 120 and the interposer 130 using pillar bumps 160. In one embodiment, the EIC 150 serves as an electrical bridge between the PIC 120 and the interposer 130 that is disposed on one side of the optoelectronic assembly 100. An array of external connections 170 are mounted on the other side of the optoelectronic assembly 100 from the EIC 150 via Input/Output (I/O) pads 180. In some embodiments, various passive components 190 are also encased in the mold compound 110.

In one embodiment, the mold compound 110 is any epoxy or substrate used to fabricate a reconstituted wafer. The reconstituted wafer includes the PIC 120 to provide an optical interface to send and/or receive optical signal from/to the optoelectronic assembly 100 via an external optical device (not illustrated). Examples of external optical devices include, but are not limited to, lasers, photodiodes, fiber optic cables, lenses, prisms, isolators, optical MUX/DMUX devices, and the like that are connected with the optical interface in the PIC 120. In various embodiments, the PIC 120 may be connected to external optical devices via evanescent coupling, edge coupling, butt coupling, grating coupling, etc.

The PIC 120 defines a first face (e.g., an exposed face 121) that extends from or is otherwise not covered by the mold compound 110 used to capture the PIC 120. This exposed face 121 includes a first portion 123 that is used for coupling with the external optical device and a second portion 124 used for coupling with the EIC 150, the interposer 130, and passive components 190. In one embodiment, the PIC 120 includes a second exposed face 122 in an intersecting plane to the first exposed face 121, such as the perpendicular second exposed face 122 illustrated in FIG. 1. However, in another embodiment, the second exposed face 122 may be in a plane parallel to the first exposed face 121 (i.e., opposite to the exposed face 121). The second exposed face 122 may be used for coupling to external electrical devices, external optical devices, the interposer 130, passive components 190, or left free of optical or electrical connections. In some embodiments, a reflective coating 125 is applied to the second exposed face 122.

The interposer 130 provides a platform to which the EIC 150 is mounted, and to which other components of the optoelectronic assembly 100 connect to the EIC 150. The interposer 130 defines a first face 131 that extends from or is otherwise not covered by the mold compound 110 used to capture the interposer 130, and is coplanar with the exposed face 121 of the PIC 120. Because the exposed face 121 of the PIC 120 and the first face 131 of the interposer 130 are both in one shared plane, the EIC 150 can evenly mount to both the PIC 120 and the interposer 130. In some embodiments, a second face 132 of the interposer 130, opposite to the first face 131, is exposed on an opposite side of the optoelectronic assembly 100, while in other embodiments, the second face 132 is encased in the mold compound 110.

The interposer 130 can be constructed of silicon, glass, ceramic, or an organic substrate that acts as a low parasitic loss electrical conduit between the EIC 150 and a Printer Circuit Board (PCB) that provides a rigid interface for flip chip bonding of the EIC 150 to the interposer 130. The interposer 130 may contain electrical components, optical components, both electrical components and optical components, or neither electrical nor optical components to support the PIC 120.

The coefficient of thermal expansion (CTE) of the mold compound 110 is designed as close to that of the PIC 120 and interposer 130 as possible, to allow for very low warpage or flexing of the molded package. The warpage, however, can also be managed by controlling the volume percentage of the interposer 130 and PIC 120 (both with lower CTEs) compared to the mold compound 110 (generally higher CTE). For example, making sure that 70-80% of the volume of the package is occupied by the PIC 120 and the interposer 130 will help lower the impact of a mold compound 110 with a high CTE (due to rule of mixtures), and will thus lower the warpage of the entire package significantly. Controlling the flexing or warpage of the molded package is important to obtain a reliable flip chip bond with the EIC 150, since the EIC 150 is bonded to both PIC 120 and Interposer 130, which are embedded in the mold compound 110 of the molded package. After flip chip bonding the EIC 150 to the molded package, the overall warpage of the package further improves due to EIC 150 acting as a rigid bridge between the PIC 120 and interposer 130 and also increasing the Silicon volume percentage (Silicon having a low CTE) of the entire package. This further helps in surface mounting the molded package to an external PCB for example.

In some embodiments, a first Redistribution Layer (RDL) 101 is formed as part of a fan-out wafer process to extend electrical contacts on the top side of the optoelectronic assembly 100 from the various constructed VIAs 140 and passive components 190 to one another, to the first face 131 of the interposer 130, and to the first portion of the exposed face 121 of the PIC 120. Additionally, electrical connections between the interposer 130 and the PIC 120 may also be established in the first RDL 101. A second RDL 102 is formed in additional embodiments as part of a fan-out wafer process to extend electrical contacts and create I/O pads 180 on the bottom side of the optoelectronic assembly 100. As will be appreciated, the RDL may be fabricated according to various photolithography processes and any I/O pads may be fabricated with Under Bump Metallization (UBM) or another metallization process known to those of skill in the art. In some embodiments, the first portion 123 of the exposed face 121 is treated with a photoresist to prevent an RDL from forming over the first portion 123. This photoresist is then removed as the final step of the molded package process, thereby exposing the top surface of the PIC 120 meant for optical attach to other components, thereby maintaining the ability of the first portion 123 to couple with external optical devices.

The EIC 150 is a chip for processing electrical signals. These signals may include analog and digital signals that are transmitted to or received from the PIC 120, or transmitted to or received from external electrical components (not illustrated) in communication with the optoelectronic assembly 100. The EIC 150 is connected to the PIC 120 and the interposer 130 via pillar bumps 160. In various embodiments, the pillar bumps 160 are pins that extend from the EIC 150 to couple with contact pads or sockets on the PIC 120 and the interposer 130. In other embodiments, the pillar bumps 160 are pins that extend from the PIC 120 and the interposer 130 to couple with contact pads or sockets on the EIC 150.

The constructed VIA 140 provides an electrical pathway between the bottom side of the optoelectronic assembly 100 and the top side of the optoelectronic assembly 100. One or more constructed VIAs 140 may be present in the optoelectronic assembly 100, and each constructed VIA 140 may include one or more pathways from the bottom side to the top side of the optoelectronic assembly 100. As used in the present disclosure, "top," "top side," and related terms refer to the side of the optoelectronic assembly 100 that the EIC 150 is to be mounted. Similarly, the present disclosures uses the terms "bottom," "bottom side," and related terms to refer to the opposite side of the optoelectronic assembly 100, where external connections 170 are arranged in an array to enable the optoelectronic assembly to mount or couple with other electrical components. In various aspects, the external connections 170 are solder balls that are part of a Ball Grid Array (BGA) or may be pins or sockets that are part of a Land Grid Array (LGA). The external connections 170 are mounted to the bottom side of the optoelectronic assembly 100 by one or more I/O pads 180 fabricated on the bottom side. In various embodiments, the I/O pads 180 are fabricated on the bottom side of the optoelectronic assembly 100 as part of an RDL.

The passive components 190 can be discrete components, such as capacitors and resistors, that are optionally embedded in the mold compound 110. The passive components 190 may be in electrical communication with the PIC 120, the interposer 130, the constructed VIAs 140, the EIC 150, and other passive components 190. Although illustrations given in the present disclosure typically show one or fewer passive components 190, it will be appreciated that more passive components 190 may be included in various embodiments made according to the present disclosure.

Figure 2:
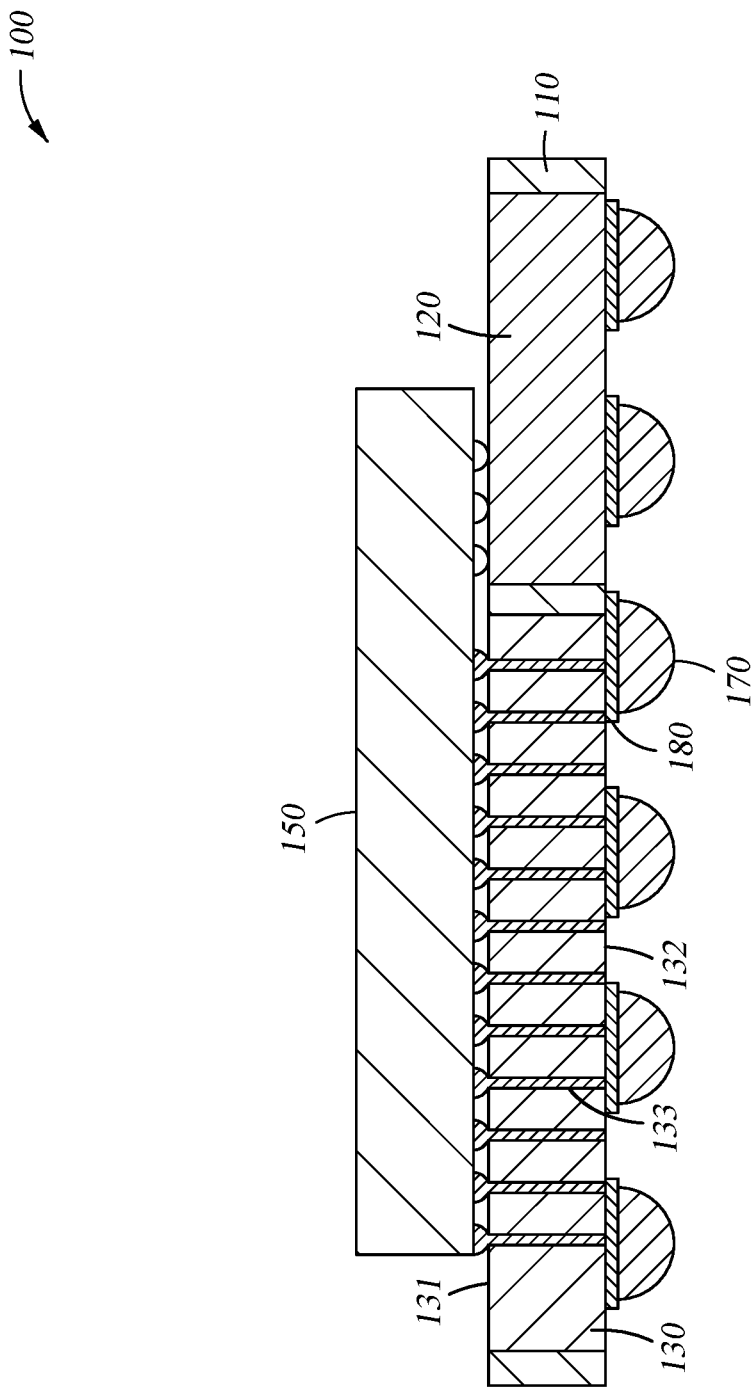
FIG. 2 illustrates a side view of an example optoelectronic assembly highlighting Vertical Interconnect Accesses according to one embodiment of the present disclosure.

FIG. 2 illustrates a side view of an example optoelectronic assembly 100 highlighting internal VIAs 133 in the interposer 130. In this example, the constructed VIAs 140 are discrete components that are embedded in the mold compound 110, but VIAs may also be fabricated through the material of the interposer 130. The internal VIAs 133 provide an electrical pathway through the optoelectronic assembly 100 between the external connections 170 and I/O pads 180, to the EIC 150 via the pillar bumps 160. The EIC 150, in turn, is electrically connected to the PIC 120 via other connectors within the pillar bumps.

In some embodiments in which the interposer 130 includes internal VIAs 133, the constructed VIAs 140 are omitted. In other embodiments in which the interposer 130 includes internal VIAs 133, the constructed VIAs 140 are included to provide additional pathways through the optoelectronic assembly 100 to the pathways provided by the internal VIAs 133. The internal VIAs 133 may be constructed in the interposer 130 prior to integration in the optoelectronic assembly 100 (e.g., through-silicon VIA interposers) or as part of the chemical vapor deposition or metallization steps in a fan-out process on a reconstituted wafer including one or more optoelectronic assemblies 100.

Figure 3A:
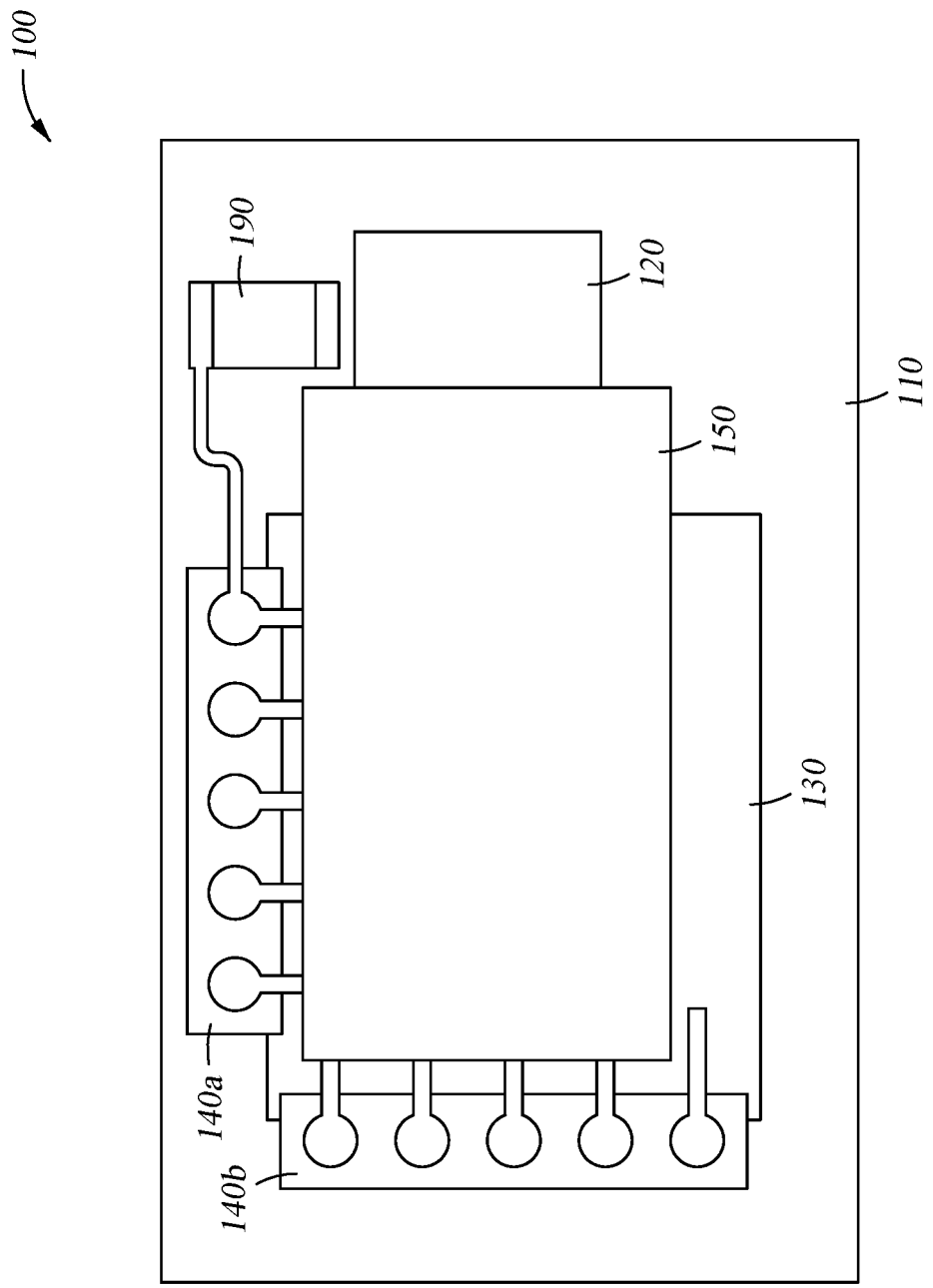
FIGS. 3A and 3B illustrate top views of example optoelectronic assemblies according to embodiments of the present disclosure.
Figure 3B:
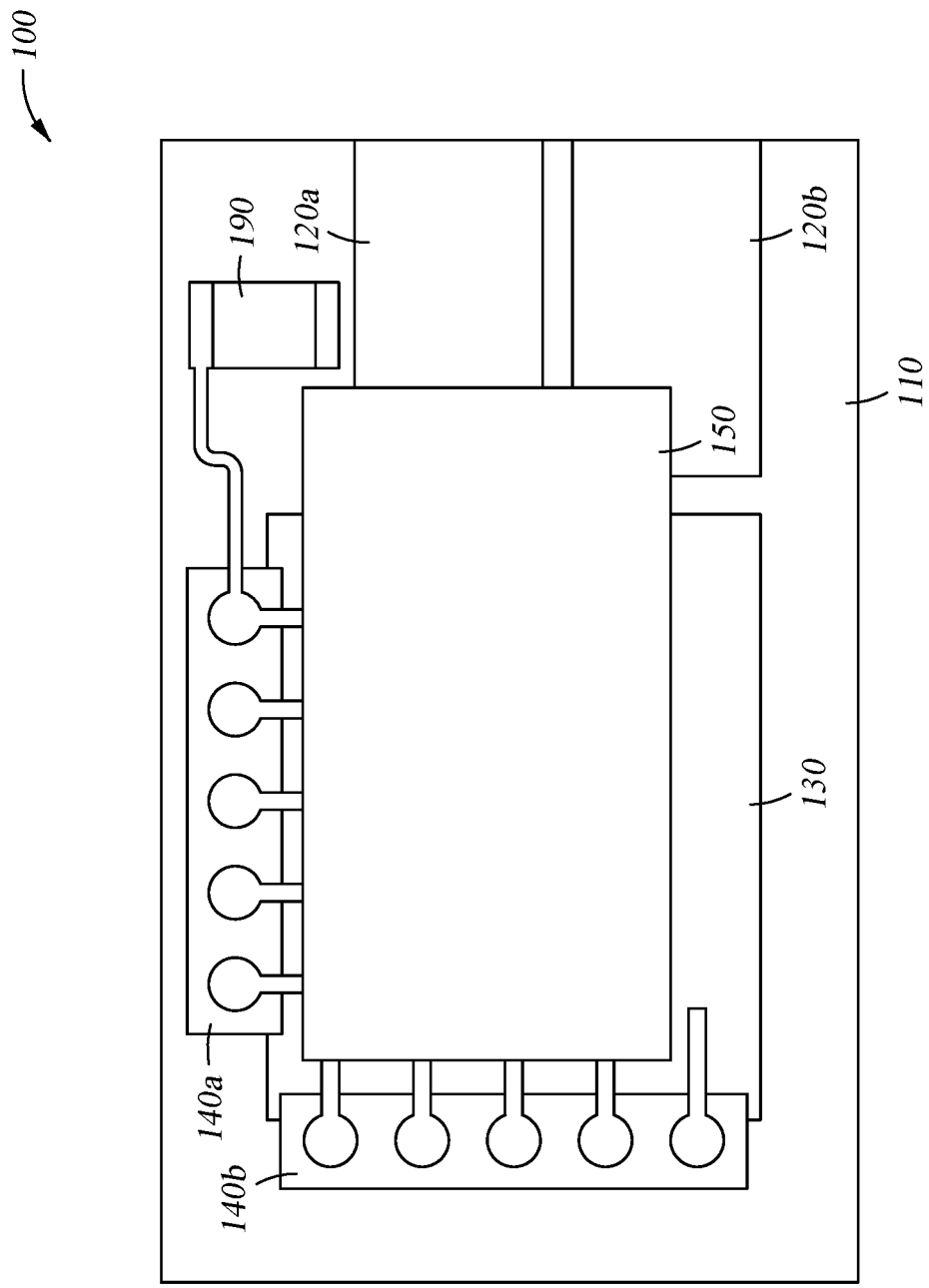

FIGS. 3A and 3B illustrate top views of example optoelectronic assemblies 100 according to embodiments of the present disclosure. Both FIGS. 3A and 3B illustrate a first constructed VIA 140a and a second constructed VIA 140b connected with an interposer 130 and a passive component 190, all embedded in a mold compound 110. Each optoelectronic assembly 100 also includes an EIC 150 connected with the interposer, but FIG. 3A shows the EIC 150 connected to one PIC 120, whereas FIG. 3B shows the EIC 150 connected to a first PIC 120a and to a second PIC 120b. It will therefore be understood that a given EIC 150 may be connected to a plurality of PICs 120.

In various embodiments, an EIC 150 may be connected to multiple PICs 120 to receive or transmit optical signals according to different power levels, having different wavelengths, to receive or transmit optical signals from multiple sources or to multiple destinations via dedicated cabling, For example, an EIC 150 may receive optical signals via a first PIC 120a, and control transmission of optical signals via a second PIC 120b. In another example, the optoelectronic assembly 100 may receive signals of a first wavelength via a first PIC 120a and signals of a second wavelength via a second PIC 120b.

Figure 4A:
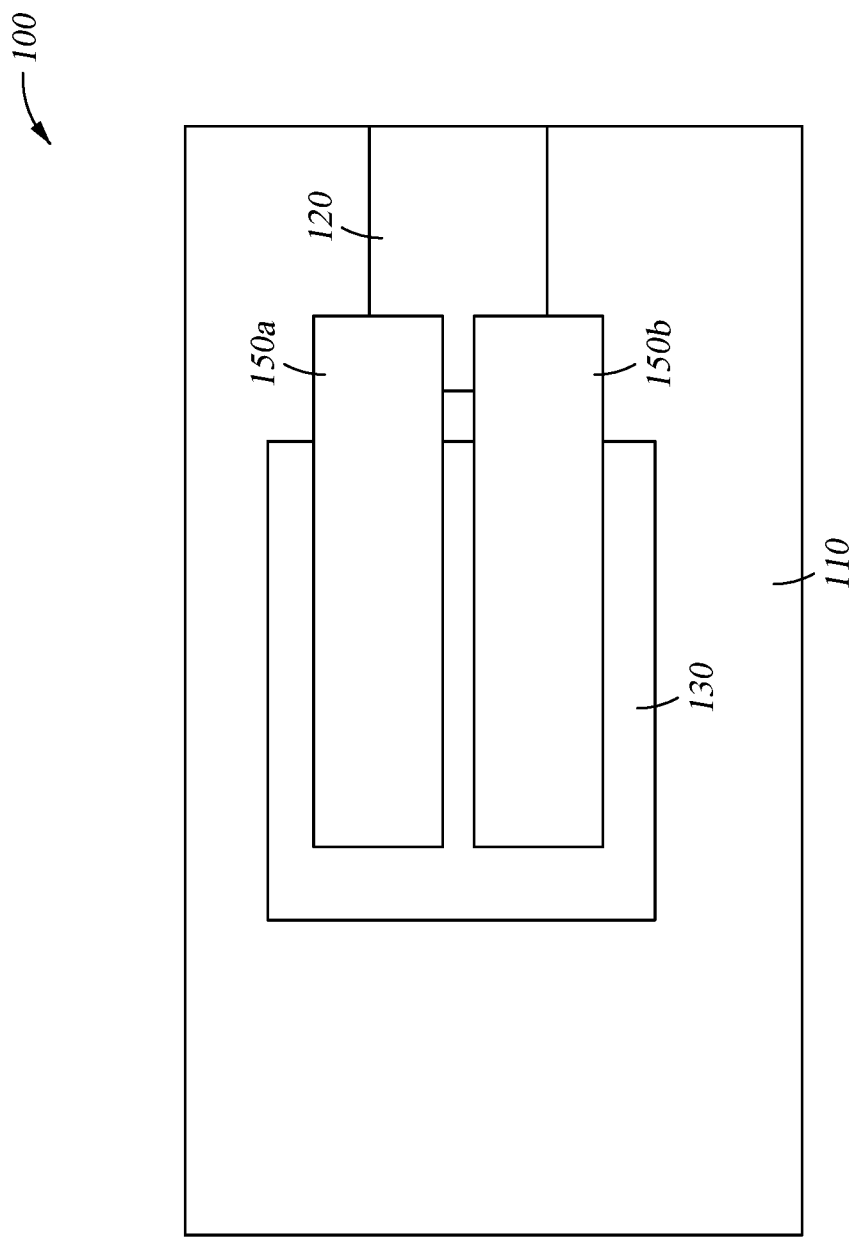
FIGS. 4A and 4B illustrate top views of example optoelectronic assemblies using two EIC bridges according to embodiments of the present disclosure.
Figure 4B:
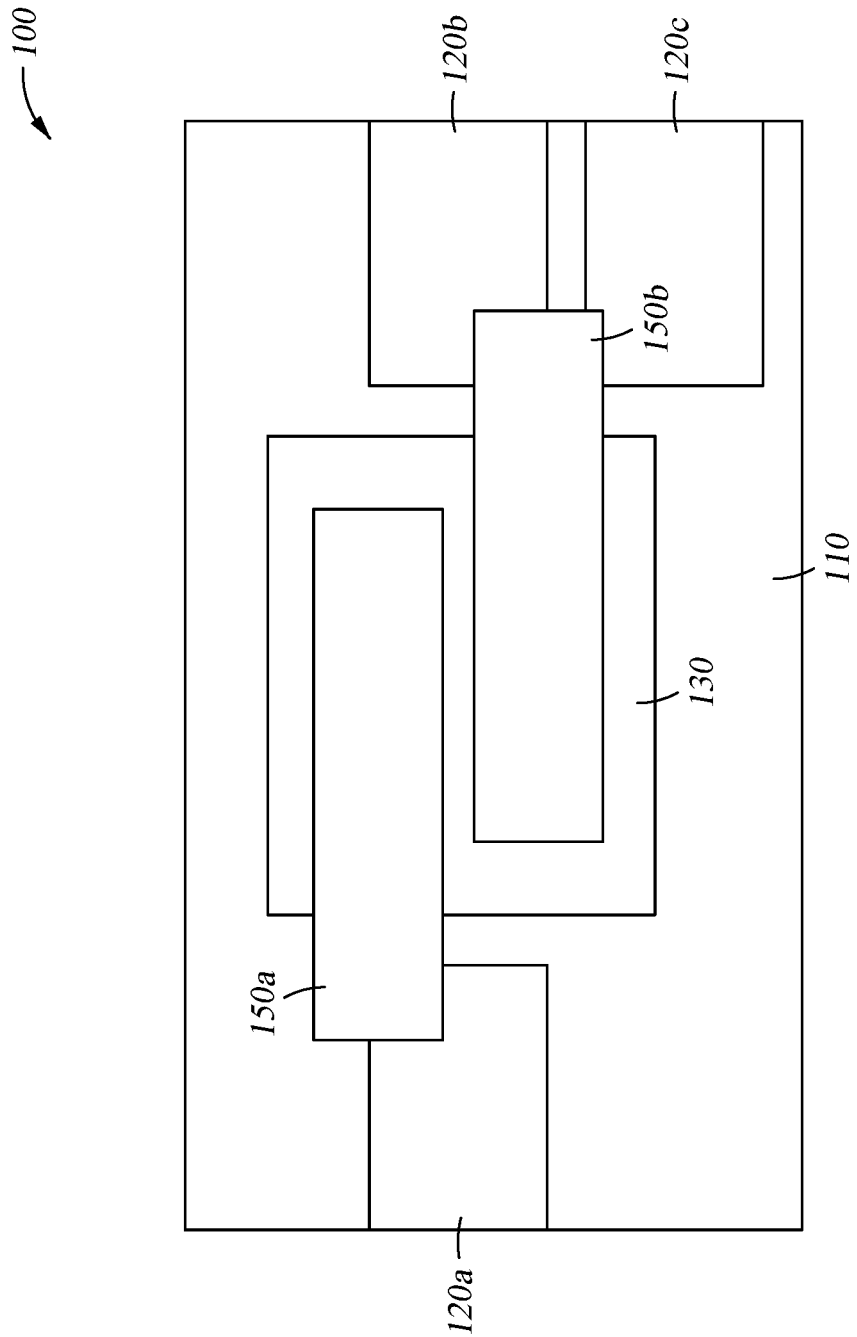

FIGS. 4A and 4B illustrate top views of example optoelectronic assemblies 100 using two EIC 150 according to embodiments of the present disclosure. Both FIGS. 4A and 3B illustrate an interposer 130 and various PICs 120 embedded in a mold compound 110. FIG. 4A illustrates a first EIC 150a and a second EIC 150b connected with the interposer 130 and one PIC 120. FIG. 4B illustrates a first EIC 150a connected with the interposer 130 and a first PIC 120a, and a second EIC 150b connected with the interposer 130, a second PIC 120b, and a third PIC 120c. In will therefore be understood that a given interposer 130 may be connected with a plurality of EIC 150, each of which may be connected to one or more PICs 120. Each of the several EIC 150 connected to an interposer 130 may be electrically connected with one another via the interposer 130, or may be isolated from one another. As will be appreciated, an EIC 150 may be connected to more than one interposer 130.

In various embodiments, an interposer 130 is connected to multiple EICs 150 to perform various functions. For example, a first EIC 150a and a second EIC 150b may be connected to a given PIC 120 to process the signals provided by the PIC 120 differently, such as via a first EIC 150a that processes analog signals and a second EIC 150b that processes digital signals. In another example, a first EIC 150a drives transmissions sent from a first PIC 120a, and a second EIC 150b processes signals received from a second PIC 120b. Additionally, a manufacturer may make use of several EICs 150 (instead of a smaller number of EICs 150) to fit pre-existing form factors of EIC 150 or use several EICs 150 whose cost of manufacture is less than a single EIC 150.

Figure 5A:
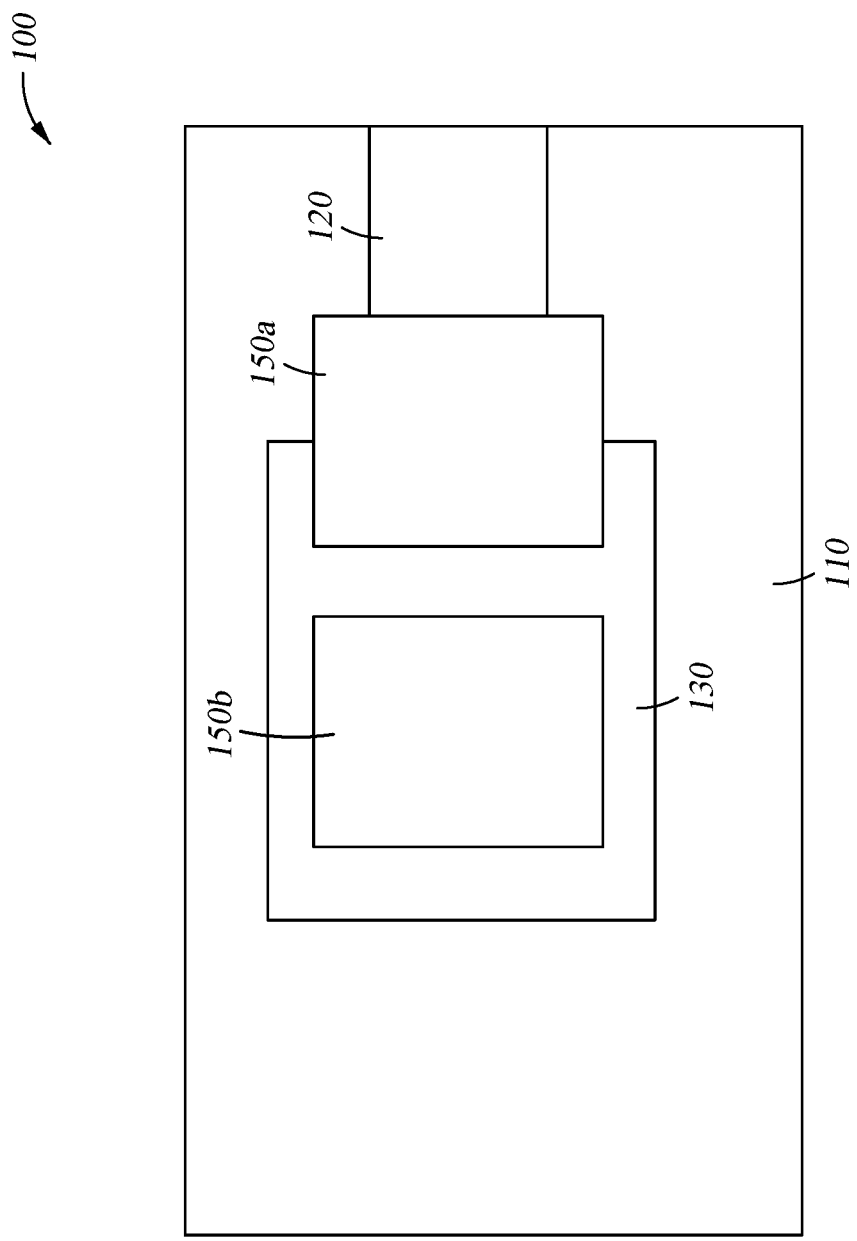
FIGS. 5A and 5B illustrate a top view and a side view, respectively, of an example optoelectronic assembly using an EIC bridge and a mounted EIC according to one embodiment of the present disclosure.
Figure 5B:
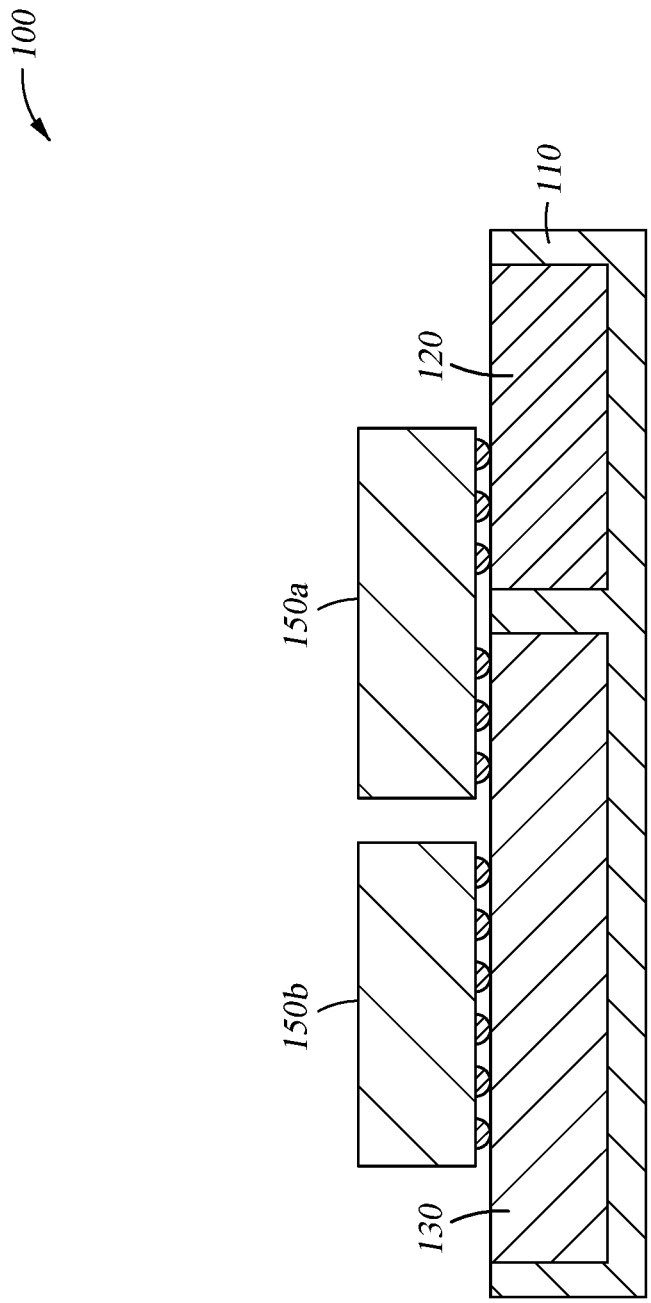

FIGS. 5A and 5B illustrate a top view and a side view, respectively, of an example optoelectronic assembly 100 using a first bridge EIC 150*a* and a second mounted EIC 150*b* according to one embodiment of the present disclosure. In FIGS. 5A and 5B, an interposer 130 and a PIC 120 embedded in a mold compound 110 are bridged by a first EIC 150*a*, and a second EIC 150*b* is mounted to the interposer 130. It will therefore be appreciated that an optoelectronic assembly 100 may include EICs 150 that do not bridge a PIC 120 with the interposer 130. The EICs 150 that are mounted to the interposer 130 are not directly electrically connected with a PIC 120. In some embodiments, these mounted EICs 150 are connected to other EICs 150, which may be directly interconnected with a PIC 120. Mounted EICs 150 may also be connected to constructed VIAs 140 or passive components 190 of the optoelectronic assembly, or may be connected to an external electrical device.

Figure 6:
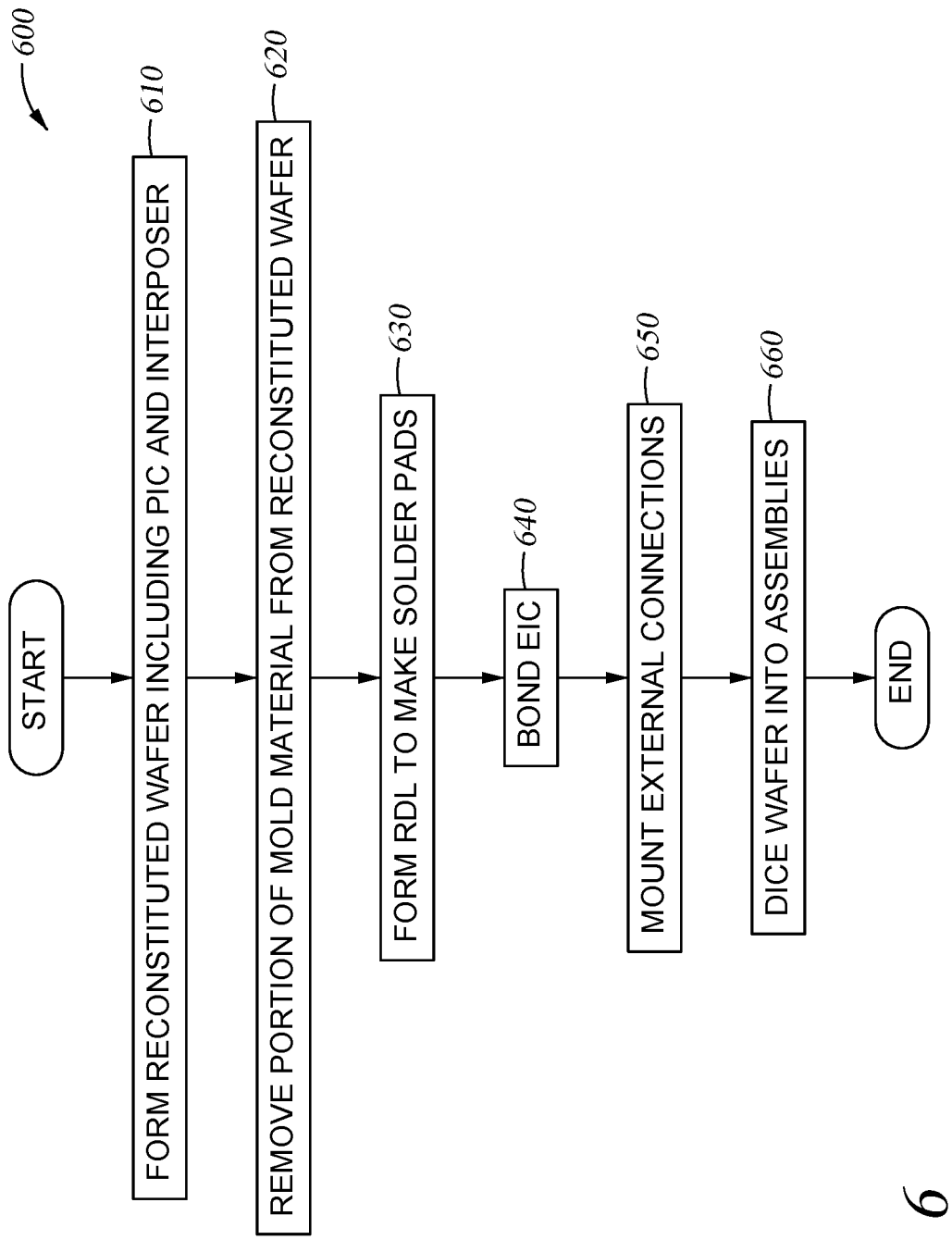
FIG. 6 illustrates a flow chart outlining general operations in an example method to fabricate optoelectronic assemblies according to one embodiment of the present disclosure.

FIG. 6 illustrates a flow chart outlining general operations in an example method 600 to fabricate optoelectronic assemblies 100 according to one embodiment of the present disclosure. Method 600 is discussed in relation to examples of various sub-assemblies created during fabrication of optoelectronic assemblies 100 illustrated in FIGS. 7A-H.

Figure 7A:
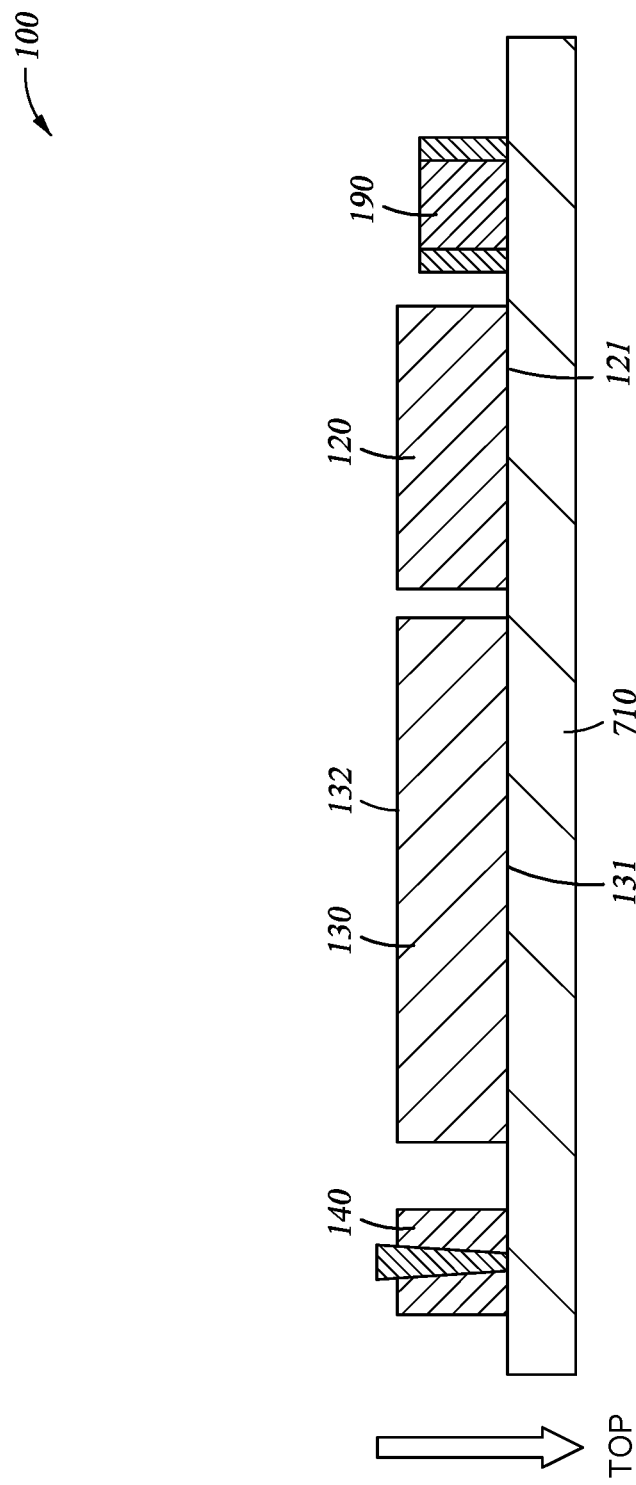
FIGS. 7A-H illustrate examples of various sub-assemblies created during fabrication of optoelectronic assemblies according to one embodiment of the present disclosure.
Figure 7B:
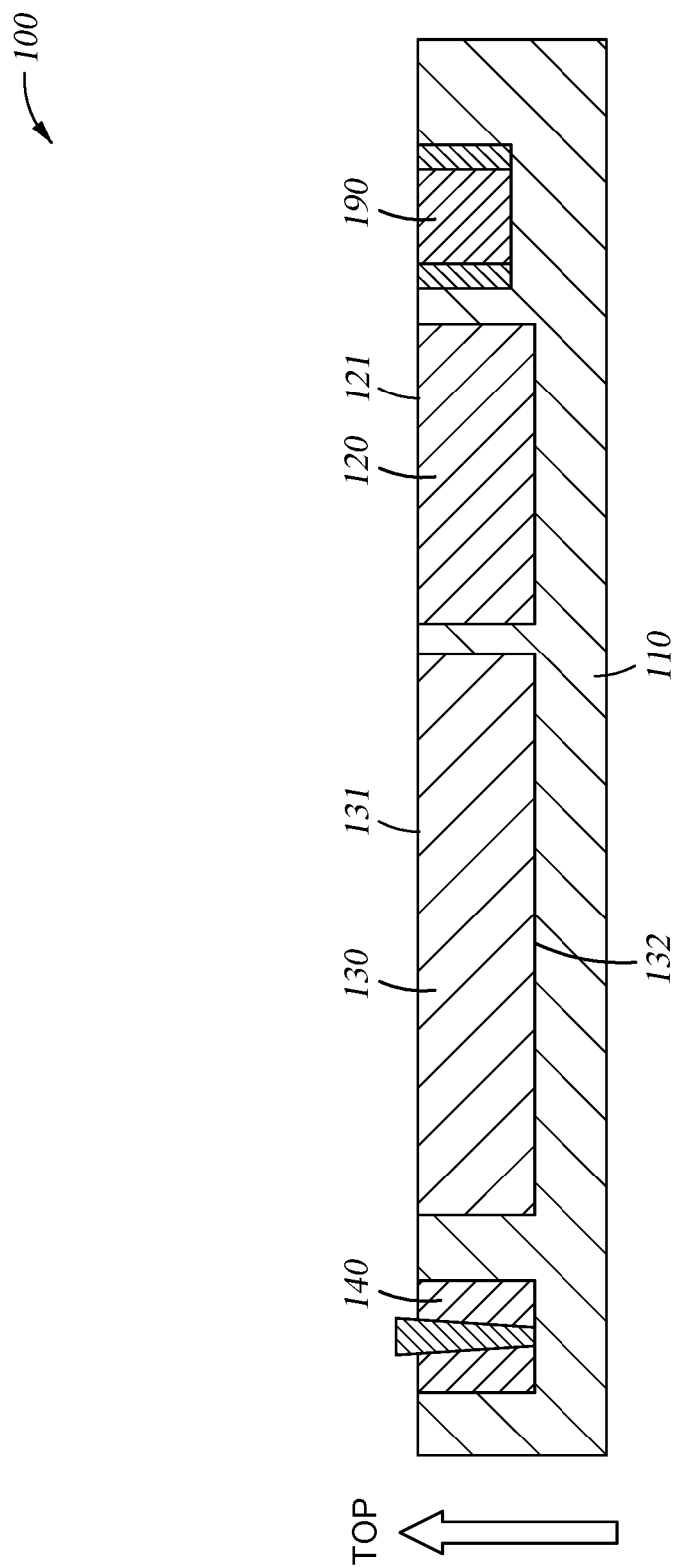

Method 600 begins with block 610, where a reconstituted wafer is formed to include at least one die for an optoelectronic assembly 100 that includes at least one PIC 120 and at least one interposer 130. In various embodiments, constructed VIAs 140 and passive components 190 are also included in the at least one die. The various PICs 120, interposers 130, (optional) constructed VIAs 140, and (optional) passive components 190 may be disposed on a carrier 710, as is illustrated in FIG. 7A, and then embedded in a mold compound 110, as is illustrated in FIG. 7B. It should be noted that additional protective layers may be added to the PIC 120 (or included in the PIC design) in order to keep mold compound 110 out of designated areas. For example, to protect optical coupling interfaces, structures such as trenches, protective/sacrificial layers, or other barriers may be added to keep mold compound 110 away from these areas or otherwise allow for the removal of the mold compound 110 without damage to the PIC 120.

The carrier 710 is in contact with what will be the exposed face 121 of the PIC 120 and the first face 131 of the interposer 130, which ensures that the exposed face 121 and the first face 131 are co-planar (i.e., disposed in one plane), are on one side of the final optoelectronic assembly 100 (i.e., the top side), and are free of the mold compound 110. In contrast, the bottom surfaces of the components of the optoelectronic assembly 100 face away from the carrier 710. The carrier 710 may be a tape or a steel carrier, as is understood in the art, to which the components of the optoelectronic assembly 100 (including the mold compound 110) are temporarily bonded. Once the mold compound 110 used to form the reconstituted wafer is set, and the interposer 130 and PIC 120 are embedded therein, the carrier 710 may be removed using a wet etch, laser release, physical peeling, or chemical release process.

Once the carrier 710 has been removed, surface feature processing may be performed on the exposed face 121, first face 131, and other faces/surfaces in the plane shared thereby (e.g., on the top side of the optoelectronic assembly 100. For example, chemical vapor deposition, electroplating or a similar process may add solder pads or pins for connection via pillar bumps 160, or may fan out electrical connections in an RDL between any constructed VIAs 140, interposers 130, PICs 120, and/or passive components 190.

Returning to the method 600, at block 620, a portion of the mold compound 110 is removed from the "bottom" side of the reconstituted wafer opposite to the side previously bonded with the carrier 710. In some embodiments, sufficient mold compound 110 is removed to expose any constructed VIAs 140 and/or a second face 132 of the interposer 130 that extend to the bottom side of the optoelectronic assembly 100; leaving an exposed bottom surface on the optoelectronic assembly 100. For example, the mold compound 110 shown in FIG. 7B may be removed from the bottom side to result in the in-process optoelectronic assembly shown in FIG. 7C. In other embodiments, the amount of mold compound 110 that is removed is such that the second face 132 of the interposer 130 is not exposed on the bottom side of the optoelectronic assembly 100. For example, the optoelectronic assembly 100 shown in FIG. 1 illustrates a completed optoelectronic assembly 100 that includes mold compound 110 between the second face 132 of the interposer 130 and the bottom side of the optoelectronic assembly 100 (as well as between the bottom surface of the PIC 120 and the bottom side of the optoelectronic assembly 100), where the external connections 170 are attached. As will be appreciated, due to thinner substrates being more vulnerable to cracking, the thickness of the mold compound 110, and whether the interposer 130 or PIC 120 are exposed on both the top and the bottom sides, may be determined based on the desired mechanical properties of the final optoelectronic assembly.

At block 630, an RDL is formed on the bottom side of the reconstituted wafer to form I/O pads 180. In various aspects, the I/O pads 180 are fabricated in electrical communication with any constructed VIAs 140 or integrated VIAs 133 present on the reconstituted wafer, but may also be fabricated at points that are electrically isolated (e.g., to maintain a pattern or provide physical-only connection points) or to electrically connect other components on the bottom side of the optoelectronic assembly 100.

Figure 7C:
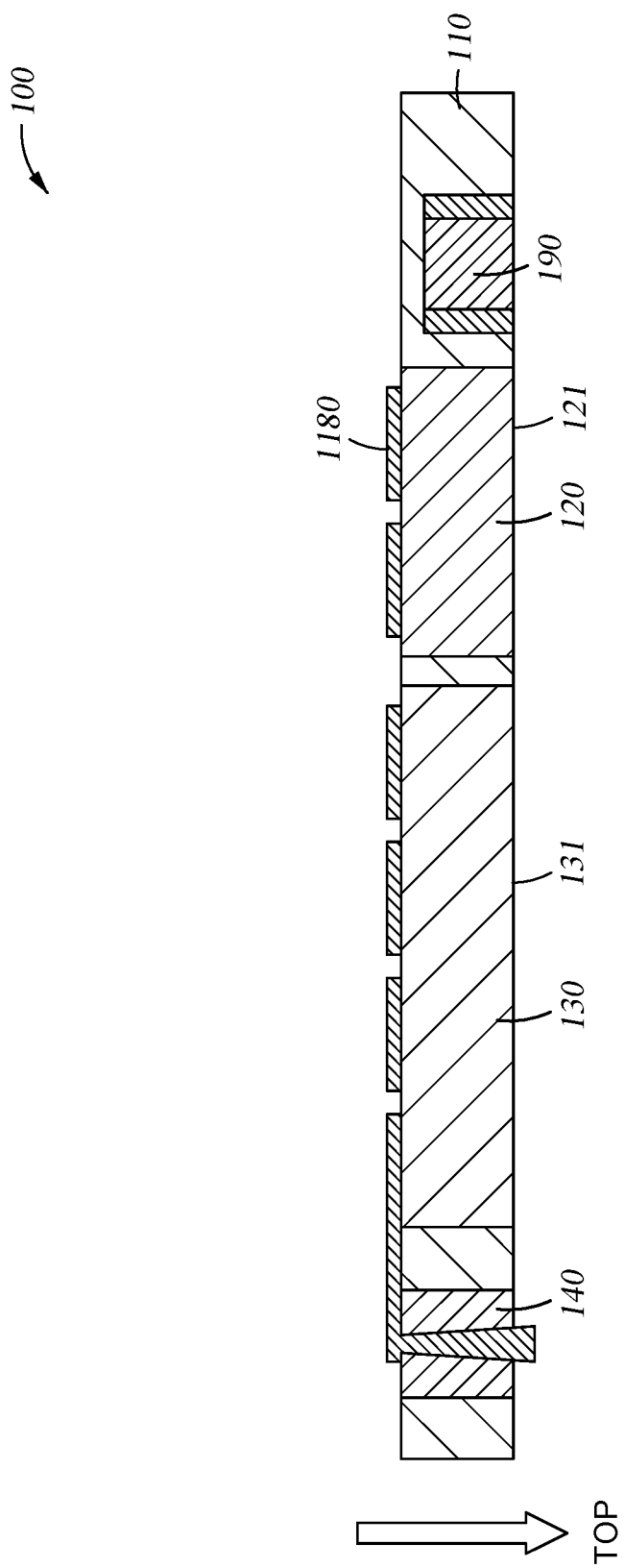

An example of the in-progress optoelectronic assembly 100 with an RDL layer formed on the bottom side is illustrated in FIG. 7C. FIG. 7C shows the top surface of the optoelectronic assembly 100 free of the mold compound 110, from which the first face 131 of the interposer 130 and the exposed face 121 of the PIC 120 extend in one plane along with a portion of a constructed VIA 140 and a passive component 190 (which may be coplanar or not coplanar). FIG. 7C also shows the bottom side of the optoelectronic assembly 100 with several I/O pads 180 fabricated thereon.

Figure 7D:
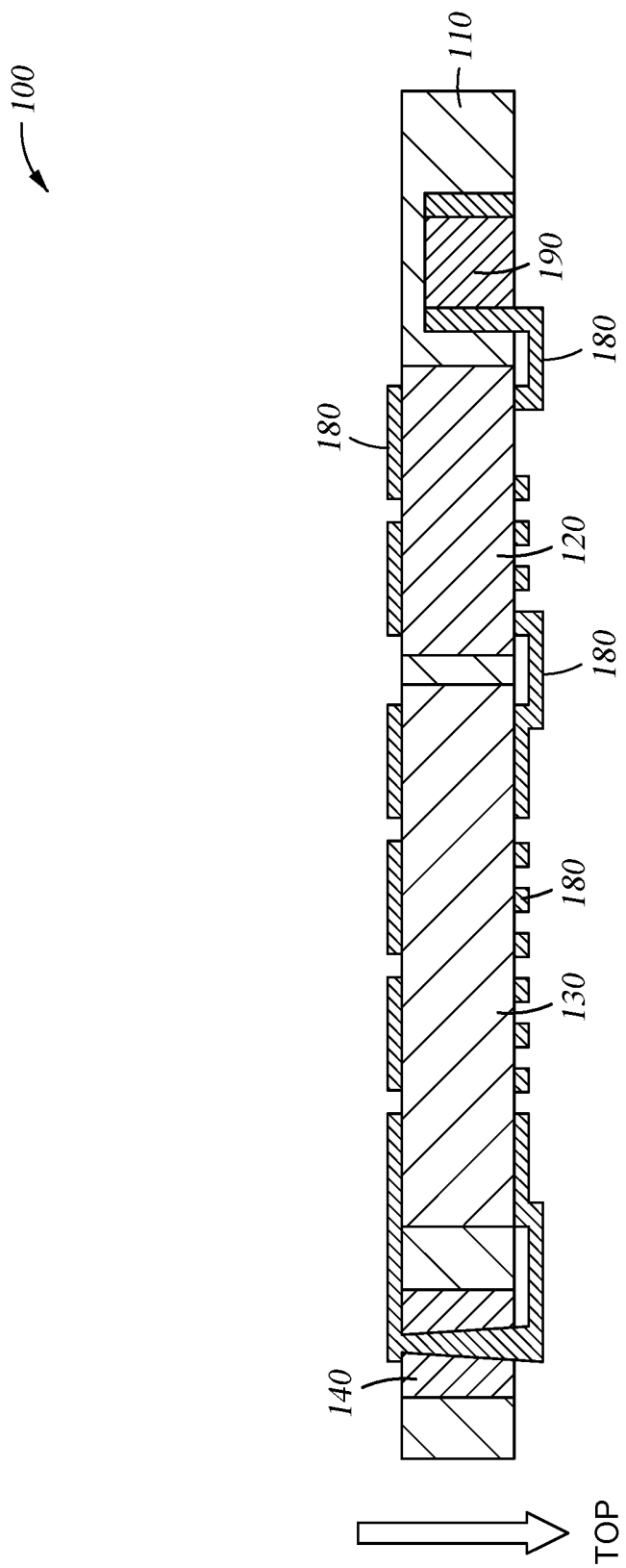

Additionally, in some embodiments, an RDL is also formed on the top side of the reconstituted wafer at block 630 to form solder pads (or other I/O connections, such as sockets or pins) and/or to fan out electrical connections between the components having an exposed surface on the top side of the reconstituted wafer, such as, for example, the interposer 130 and the PIC 120. An example of the in-progress optoelectronic assembly 100 with an RDL layer formed on the bottom side and a second RDL layer formed on the top side is illustrated in FIG. 7D. FIG. 7D shows the top surface of the optoelectronic assembly 100 free of the mold compound 110, from which the first face 131 of the interposer 130 and the exposed face 121 of the PIC 120 extend in one plane along with a portion of a constructed VIA 140 and a passive component 190 (which may be coplanar or not coplanar). FIG. 7D also shows the bottom side of the optoelectronic assembly 100 with several I/O pads 180 fabricated thereon and several I/O pads 180 formed on the first face 131 of the interposer 130 and the exposed face 121 of the PIC 120. In some aspects, the I/O pads 180 are formed on one or more of the first face 131 of the interposer 130 and the exposed face 121 of the PIC 120 prior to forming the reconstituted wafer.

Figure 7E:
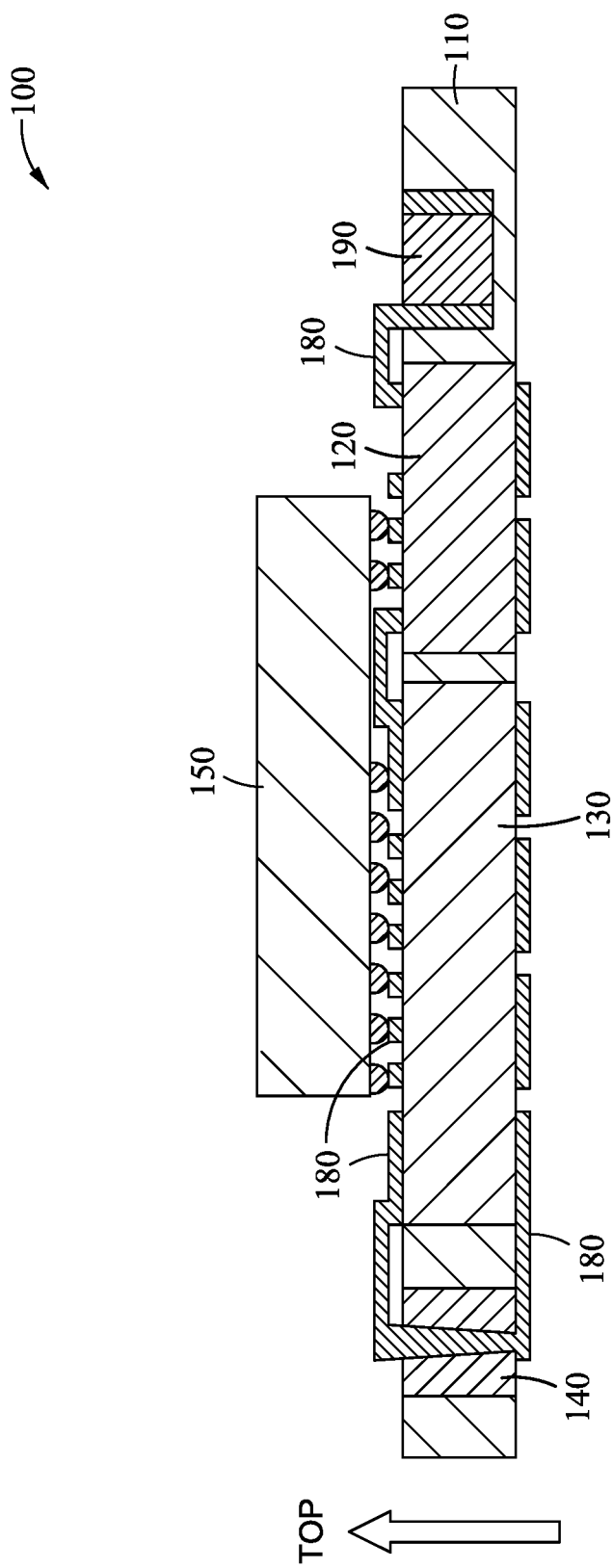

An EIC 150 is bonded to the interposer 130 and the PIC 120 at block 640, an illustration of which is shown in FIG. 7E. The EIC 150 is coupled with the interposer 130 and the PIC 120 via pillar bumps 160 established between the EIC 150 and the I/O pads on the first face 131 of the interposer 130 and the exposed face 121 of the PIC 120.

Figure 7F:
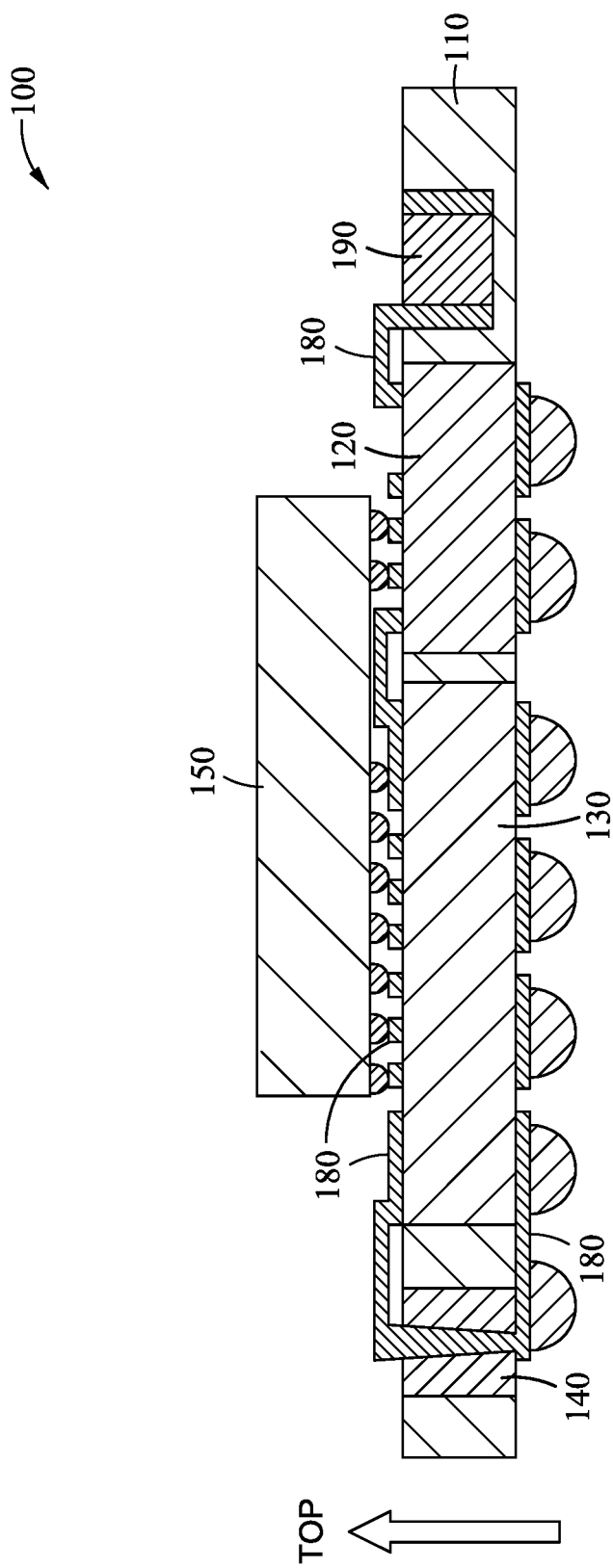

Proceeding to block 650, external connections 170 are mounted on the bottom side of the optoelectronic assembly 100. In various embodiments, the external connections 170 include a BGA of solder balls to electrically and physically couple the optoelectronic assembly 100 to an external electrical device, as is illustrated in FIG. 7F. In other embodiments, the external connections 170 include the pins or sockets of an LGA.

Figure 7G:
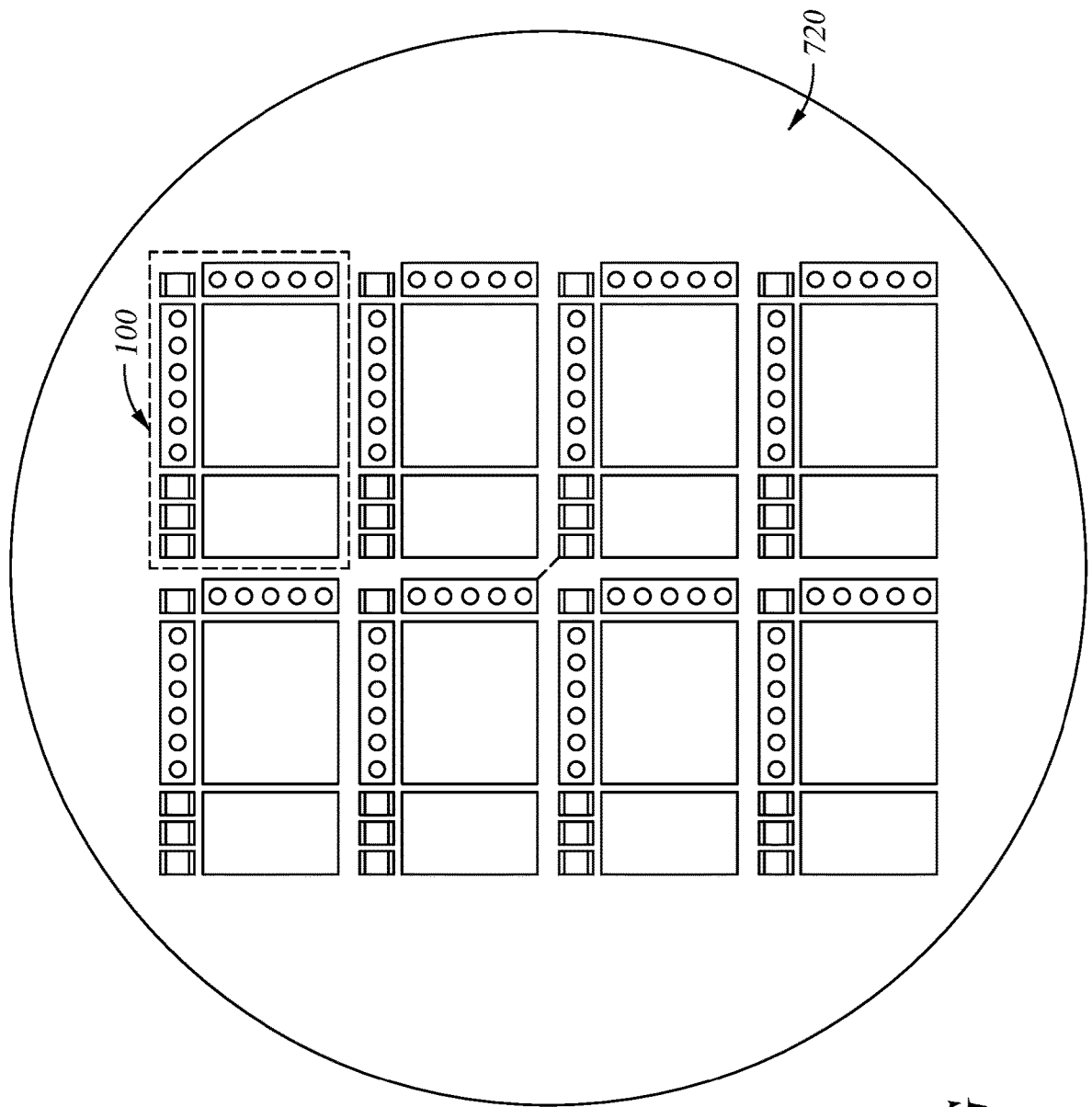
Figure 7H:
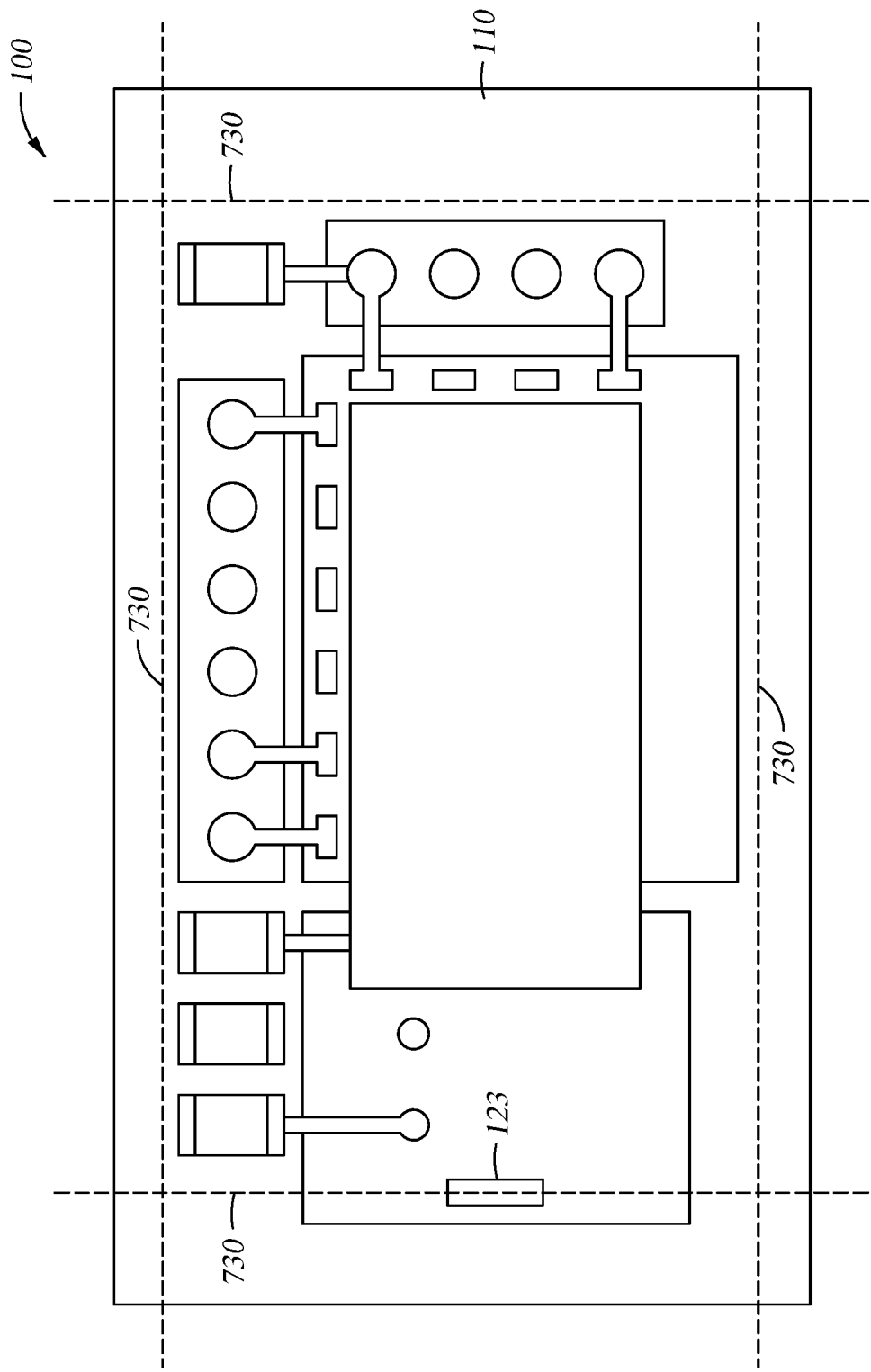

At block 660 the reconstituted wafer is diced into one or more optoelectronic assemblies 100 having a predefined shape. FIG. 7G illustrates a top view of a pre-diced reconstituted wafer 720 including several dies of optoelectronic assemblies 100. As shown in FIG. 7G, each die includes a co-planer PIC 120 and interposer 130 embedded in the mold compound 110, and an EIC 150 couple with the PIC and the interposer 130 as shown in greater detail in regard to FIG. 7H. FIG. 7H illustrates a top view of one optoelectronic assembly 100 and several dice lines 730 at which to cut the surrounding mold compound 110 of the pre-diced reconstituted wafer 720 away from the mold compound 110 and other components of the optoelectronic assembly 100. The optoelectronic assembly 100 is ready to be coupled with an external electrical device (e.g., via the external connections 170) and to an external optical device (e.g., via the first portion 123 of the exposed face 121 of the PIC 120). Note that in order to facilitate coupling between the PIC 120 and external optical components, the dicing process may be modified based on the PIC design and intended use profile. For example, if it is desired to couple optical components to the edge of the PIC 120, portions of the PIC 120 may be designed such that part of the PIC 120 is cut away during this final dicing step to provide a second exposed face 122 as an optical surface for coupling.

Method 600 may then conclude.

Embodiments of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods, and computer program products according to various embodiments. In this regard, each block in the flowchart or block diagrams may represent a module, segment or portion of code, which comprises one or more executable instructions for implementing the specified logical function(s). It should also be noted that, in some other implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method of fabricating optoelectronic assemblies, comprising:
    positioning a Photonic Integrated Circuit (PIC) and an interposer on a carrier, wherein the PIC has a first face and the interposer has a second face coplanar with the first face;
    encapsulating the PIC and the interposer using a mold compound to form a reconstituted wafer including the PIC and the interposer, the reconstituted wafer having a first side coplanar with the first face and a second side opposite to the first side, wherein the mold compound does not cover the first face and the second face;
    removing a portion of the mold compound from the second side to reveal a portion of the interposer opposite to the second face; and
    bonding an Electrical Integrated Circuit (EIC) with the first face and the second face to electrically bridge the PIC and the interposer through the EIC.

2. The method of claim 1, further comprising prior to bonding the EIC:
    fabricating Input/Output (I/O) pads in a redistribution layer (RDL) on the second side of the reconstituted wafer.

3. The method of claim 2, further comprising:
    fabricating I/O pads in a second RDL on the first side of the reconstituted wafer on the first face of the PIC and the second face of the interposer.

4. The method of claim 2, further comprising:
    mounting external connections on the second side of the reconstituted wafer, wherein the external connections include one of the group of a ball grid array and a land grid array.

5. The method of claim 1, further comprising:
    dicing the reconstituted wafer to produce at least one die including the PIC, the interposer, and the EIC.

6. The method of claim 1, wherein a first portion of the first face of the PIC that is exposed from the mold compound is in communication with an external optical device, and wherein a second portion of the first face of the PIC that is exposed from the mold compound is coupled to the EIC.

7. The method of claim 1, wherein the interposer has a Coefficient of Thermal Expansion (CTE) matched to a CTE of the mold compound.

8. A method of fabricating optoelectronic assemblies, comprising:
   positioning a Photonic Integrated Circuit (PIC) and an interposer on a carrier, wherein the PIC has a first face and a second face perpendicular to the first face, and the interposer has a third face coplanar with the first face;
   encapsulating the PIC and the interposer using a mold compound to form a reconstituted wafer including the PIC and the interposer, the reconstituted wafer having a first side coplanar with the first face and the third face and having a second side opposite to the first side, wherein the mold compound does not cover the first face and the second face;
   removing a portion of the mold compound from the second side to reveal a portion of the interposer opposite to the third face and the second face; and
   bonding an Electrical Integrated Circuit (EIC) with the first face and the third face to electrically bridge the PIC and the interposer through the EIC.

9. The method of claim 8, further comprising prior to bonding the EIC:
   fabricating Input/Output (I/O) pads in a redistribution layer (RDL) on the second side of the reconstituted wafer.

10. The method of claim 9, further comprising:
    fabricating I/O pads in a second RDL on the first side of the reconstituted wafer on the first face of the PIC and the third face of the interposer.

11. The method of claim 9, further comprising:
    mounting external connections on the second side of the reconstituted wafer, wherein the external connections include one of the group of a ball grid array and a land grid array.

12. The method of claim 8, further comprising:
    dicing the reconstituted wafer to produce at least one die including the PIC, the interposer, and the EIC.

13. The method of claim 8, wherein a first portion of the first face of the PIC that is exposed from the mold compound is in communication with an external optical device, and wherein a second portion of the first face of the PIC that is exposed from the mold compound is coupled to the EIC.

14. The method of claim 8, wherein the interposer has a Coefficient of Thermal Expansion (CTE) matched to a CTE of the mold compound.

15. A method, comprising:
    positioning a Photonic Integrated Circuit (PIC) on a carrier, wherein the PIC includes:
    a first face;
    a second face opposite to the first face; and
    a third face perpendicular to the first face;
    positioning an interposer on the carrier, wherein the interposer includes:
    a fourth face coplanar with the first face; and
    a fifth face coplanar with the second face;
    encapsulating the PIC and the interposer using a mold compound to form a reconstituted wafer including the PIC and the interposer, wherein the reconstituted wafer has a first side coplanar with the first face and the fourth face and a second side coplanar with the second face and the fifth face, wherein the mold compound does not cover the first face and the fourth face and the mold compound does cover the second face and the third face;
    removing a portion of the mold compound from the second face, the third face; and
    bonding an Electrical Integrated Circuit (EIC) with the first face and the fourth face to electrically bridge the PIC and the interposer through the EIC.

16. The method of claim 15, wherein the interposer has a Coefficient of Thermal Expansion (CTE) matched to a CTE of the mold compound.

17. The method of claim 15, fabricating Input/Output (I/O) pads in a redistribution layer (RDL) on the second side of the reconstituted wafer.

* * * * *

UNITED STATES PATENT AND TRADEMARK OFFICE
CERTIFICATE OF CORRECTION

| | | |
|---|---|---|
| PATENT NO. | : 11,784,175 B2 | Page 1 of 1 |
| APPLICATION NO. | : 17/302853 | |
| DATED | : October 10, 2023 | |
| INVENTOR(S) | : Matthew J. Traverso et al. | |

It is certified that error appears in the above-identified patent and that said Letters Patent is hereby corrected as shown below:

In the Specification

In Column 1, Line 12, delete "entirety" and insert -- entirety. --.

In Column 6, Line 31, delete "cabling," and insert -- cabling. --.

In Column 6, Line 41, delete "3B" and insert -- 4B --.

In Column 6, Line 47, delete "In" and insert -- It --.

Signed and Sealed this
Sixteenth Day of July, 2024

*Katherine Kelly Vidal*

Katherine Kelly Vidal
*Director of the United States Patent and Trademark Office*